US009054186B2

(12) United States Patent
Oxland

(10) Patent No.: US 9,054,186 B2
(45) Date of Patent: *Jun. 9, 2015

(54) III-V COMPOUND SEMICONDUCTOR DEVICE HAVING METAL CONTACTS AND METHOD OF MAKING THE SAME

(71) Applicant: Taiwan Semiconductor Manufacturing Co., Ltd., Hsin-Chu (TW)

(72) Inventor: Richard Kenneth Oxland, Brussels (BE)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/499,308

(22) Filed: Sep. 29, 2014

(65) Prior Publication Data

US 2015/0014792 A1    Jan. 15, 2015

Related U.S. Application Data

(63) Continuation of application No. 13/542,860, filed on Jul. 6, 2012, now Pat. No. 8,866,195.

(51) Int. Cl.
*H01L 21/02* (2006.01)
*H01L 29/78* (2006.01)
(Continued)

(52) U.S. Cl.
CPC ............ *H01L 29/7833* (2013.01); *H01L 29/45* (2013.01); *H01L 27/0605* (2013.01);
(Continued)

(58) Field of Classification Search
CPC ............ H01L 29/7833; H01L 29/4933; H01L 29/452; H01L 29/45; H01L 23/53266; H01L 21/28575; H01L 23/485; H01L 29/78681; H01L 29/7839; H01L 27/0605; H01L 29/66462; H01L 29/2003; H01L 29/7787; H01L 29/7783; H01L 29/66431; H01L 29/41766; H01L 29/517; H01L 29/7848
USPC ................... 438/199, 604; 257/200, 201, 274
See application file for complete search history.

(56) References Cited

U.S. PATENT DOCUMENTS 5,606,184 A     2/1997  Abrokwah et al.
2006/0255366 A1  11/2006  Sheppard et al.
(Continued)

FOREIGN PATENT DOCUMENTS

JP    2012-049248      3/2012
KR    10-2006-0127046  12/2006
KR    10-2007-0114463  12/2007

OTHER PUBLICATIONS

Zhang, X. et al, "In0.7Ga0.3As Channel n-MOSFET with Self-Aligned Ni-InGaAs Source and Drain", Electrochemical and Solid-State Letters, 2011, 14(2):H60-H62.
(Continued)

*Primary Examiner* — Michelle Mandala
(74) *Attorney, Agent, or Firm* — Duane Morris LLP

(57) ABSTRACT

A semiconductor device comprises a semiconductor substrate; a channel layer of at least a first III-V semiconductor compound above the semiconductor substrate; a gate stack structure above a first portion of the channel layer; a source region and a drain region comprising at least a second III-V semiconductor compound above a second portion of the channel layer; and a first metal contact structure above the S/D regions comprising a first metallic contact layer contacting the S/D regions. The first metallic contact layer comprises at least one metal-III-V semiconductor compound.

20 Claims, 15 Drawing Sheets

(51) Int. Cl.
  *H01L 29/45* (2006.01)
  *H01L 27/06* (2006.01)
  *H01L 21/285* (2006.01)
  *H01L 23/485* (2006.01)
  *H01L 23/532* (2006.01)
  *H01L 29/786* (2006.01)
  *H01L 29/49* (2006.01)
  *H01L 29/205* (2006.01)

(52) U.S. Cl.
  CPC ...... *H01L21/28575* (2013.01); *H01L 29/7839* (2013.01); *H01L 29/205* (2013.01); *H01L 23/485* (2013.01); *H01L 23/53266* (2013.01); *H01L 29/78681* (2013.01); *H01L 2924/0002* (2013.01); *H01L 29/452* (2013.01); *H01L 29/4933* (2013.01)

(56) References Cited

U.S. PATENT DOCUMENTS

| | | | |
|---|---|---|---|
| 2008/0237636 | A1 | 10/2008 | Jin et al. |
| 2010/0258869 | A1 | 10/2010 | Morita et al. |
| 2012/0049201 | A1 | 3/2012 | Yamaguchi et al. |
| 2013/0234205 | A1 | 9/2013 | Oxland |
| 2013/0277752 | A1 | 10/2013 | Glass et al. |
| 2013/0299895 | A1 | 11/2013 | Oxland |

OTHER PUBLICATIONS

Oxland, R. et al., "An Ultralow-Resistance Ultrashallow Metallic Source/Drain Contact Scheme for III-V NMOS", IEEE Electron Device Letters, Apr. 2012, 32(4):501-503.

Kim, S.H. et al, "Self-aligned metal source/drain InxGA1-xAs n-MOSFETs using Ni-InGaAs alloy", 2010 IEEE International Electron Devices Meeting (IEDM), Dec. 2010, pp. 26.6.1-26.6.4.

Official Action issued Apr. 23, 2014 in counterpart KR Patent Application No. 10-2013-0049445.

Zhang, X. et al., "In0.7Ga0.3As Channel n-MOSFETs with a Novel Self-Aligned Ni-InGaAs Contact formed using a Salicide-like Metallization Process", 2011 International Symposium on VLSI Technology, Systems and Applications (VLSI-TSA), Apr. 2011, 2 pages.

Kim, S.H. et al., "Self-aligned metal source/drain InP n-metal-oxide-semiconductor field-effect transistors using Ni-InP metallic alloy", Applied Physics Letters, 2011, 98, 3 pages.

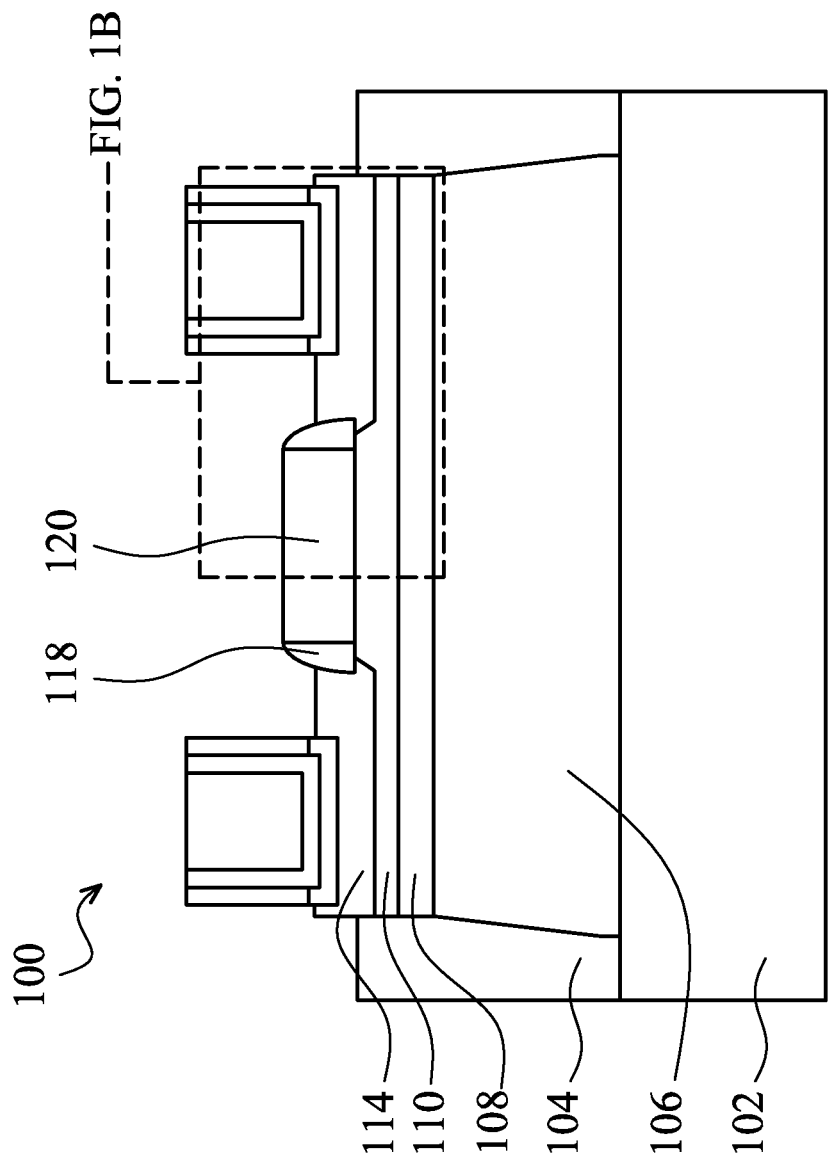

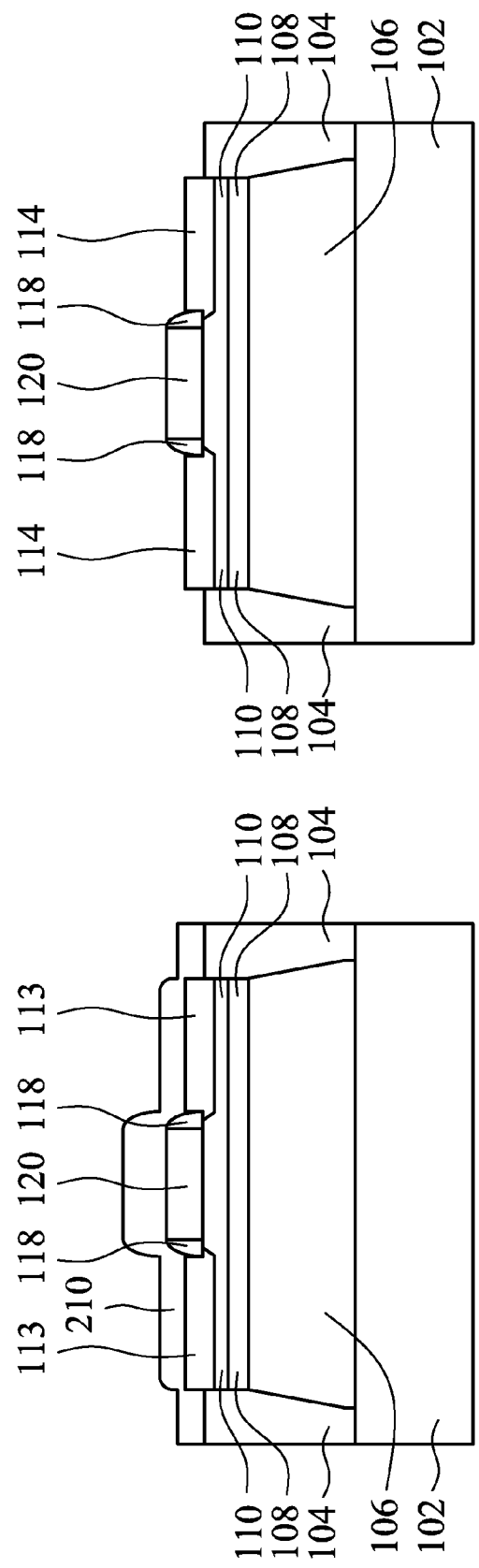

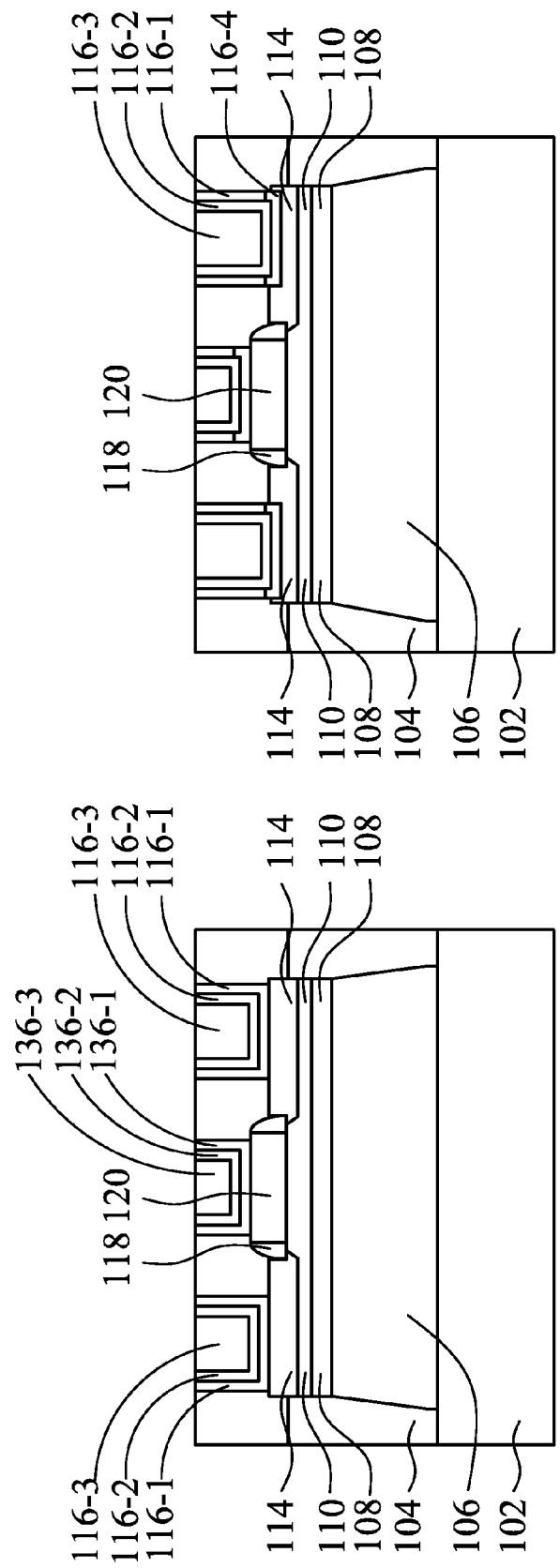

US 9,054,186 B2
III-V COMPOUND SEMICONDUCTOR DEVICE HAVING METAL CONTACTS AND METHOD OF MAKING THE SAME

PRIORITY CLAIM AND CROSS-REFERENCE

This application is a continuation of U.S. patent application Ser. No. 13/542,860, filed Jul. 6, 2012, which application is expressly incorporated by reference herein in its entirety.

FIELD

The disclosure relates to III-V compound semiconductor device, and methods of manufacturing the same.

BACKGROUND

As complementary metal oxide semiconductor (CMOS) devices are scaled to smaller sizes, new materials and concepts are being considered to meet advanced performance targets.

CMOS technology includes N-type metal oxide semiconductor (NMOS) and P-type metal oxide semiconductor (PMOS). For example, a metal-oxide-semiconductor field-effect transistor (MOSFET) is a transistor used for amplifying or switching electronic signals. One aspect of high performance in NMOS and PMOS and various other devices is device switching frequency. Contacts are made to the gate electrodes, and to both the source and drain regions, of the transistors.

III-V compound semiconductors are potential channel materials for future CMOS devices because of their high mobility and low effective mass. One challenge is to reduce resistance in the source/drain (S/D) extensions to maximize the performance of the transistors in III-V semiconductor CMOS technology.

BRIEF DESCRIPTION OF THE DRAWINGS

The present disclosure is best understood from the following detailed description when read in conjunction with the accompanying drawings. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIG. 1A illustrates a cross-sectional view of an exemplary III-V semiconductor CMOS device in accordance with some embodiments of the disclosure.

FIGS. 6-15 illustrate structures of different stages in the methods of fabricating the exemplary CMOS device in accordance with some embodiments.

FIG. 6 illustrates an exemplary CMOS device having a channel layer comprising a III-V semiconductor compound during fabrication, in accordance with some embodiments.

FIG. 7 illustrates the CMOS device of FIG. 6 after a step of recessing the channel layer through etching in accordance with some embodiments.

FIG. 8 illustrates the structure of the CMOS device of FIG. 7 after disposing the S/D regions through selective epitaxial growth, in accordance with some embodiments.

FIGS. 9-10 illustrates device structures in a method of forming a metallic metal-semiconductor compound material in the S/D regions, comprising coating a layer of metal followed by annealing at a raised temperature in accordance with some embodiments.

FIG. 9 illustrates the structure of the CMOS device of FIG. 8 after coated with a layer of metal in accordance with some embodiments.

FIG. 10 illustrates the CMOS device of FIG. 9 after a step of annealing at a raised temperature in accordance with some embodiments.

FIGS. 11-15 illustrates a process of forming a first metal contact structure above the S/D regions and/or the metal contact structure comprising a first metallic contact layer contacting the S/D regions, in accordance with some embodiments.

FIG. 11 is the cross-section view of the structure after a dielectric material is deposited onto the CMOS device of FIG. 10, in accordance with some embodiments.

FIG. 12 illustrates the structure after a dielectric material is etched to form contact openings onto the CMOS device of FIG. 11, in accordance with some embodiments.

FIG. 13 illustrates a process of cleaning the contact opening of the CMOS device of FIG. 12, in accordance with some embodiments.

FIG. 14 illustrates the exemplary CMOS device of FIG. 13 after steps of disposing a metal layer contacting the S/D regions and/or the gate stack structure, forming a diffusing layer and forming a metal plug, in accordance with some embodiments.

FIG. 15 illustrates the exemplary CMOS device of FIG. 14 after a step of annealing at a raised temperature, in accordance with some embodiments.

DETAILED DESCRIPTION

Figure 1B:
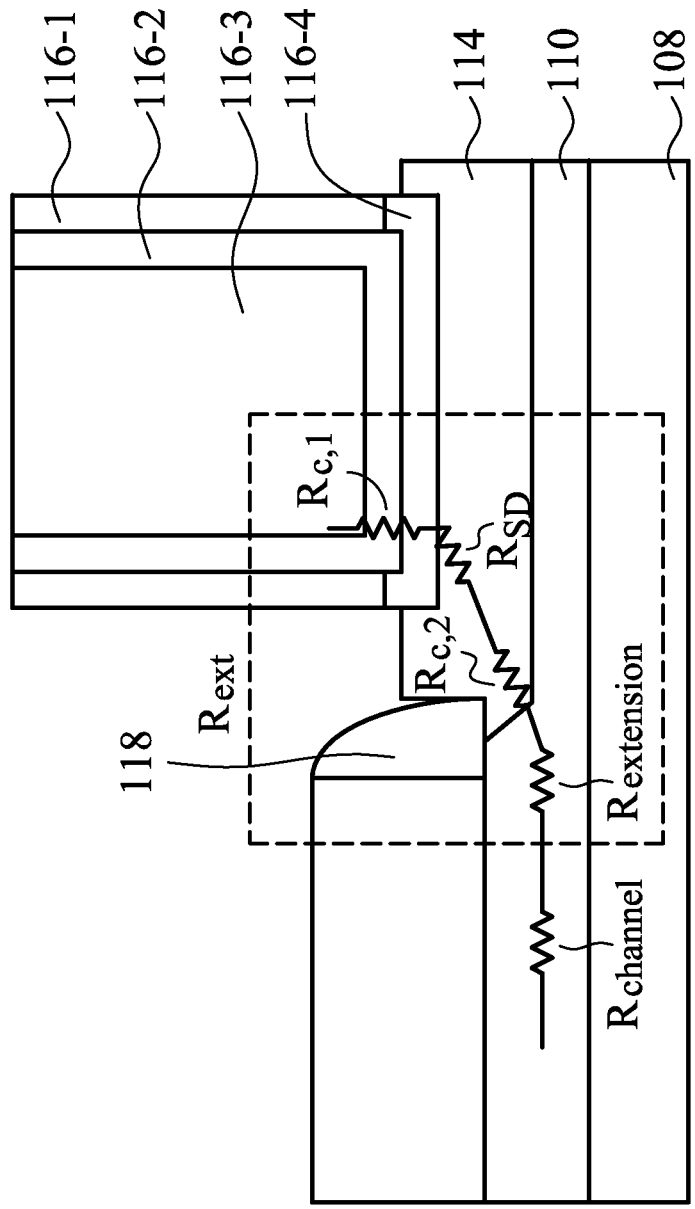
FIG. 1B is an enlarged detail of FIG. 1A, showing components in the source/drain (S/D) region of the CMOS device resistance in accordance with some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

III-V compound semiconductors are potential channel materials for future CMOS devices because of their high electron mobility. In III-V semiconductor CMOS devices, some challenges include reducing resistance in the source/drain extension regions and reducing source/drain contact resistance. For devices to operate at high frequencies, a low contact resistance is provided between metal interconnect structures and the channel of the NMOS and PMOS transistors.

In some embodiments, a III-V compound semiconductor device and a method of making the same are provided to reduce external/extrinsic resistance in the S/D extension region. The semiconductor device comprises a semiconductor substrate; active layers of at least one III-V semiconductor compound comprising a channel above the semiconductor substrate; a gate stack region above a first portion of the channel layer; a source region and a drain region on either side of the gate region in a second portion of the channel layer in some embodiments extending above the position of the surface of the channel layer; and a first metal contact structure above the S/D regions. Such metal contact structure comprises a first metallic contact layer containing at least one metal-III-V semiconductor compound contacting the S/D regions. In some embodiments, the first metallic contact layer is partially or fully embedded in the S/D regions. In some embodiments, the exemplary III-V semiconductor device comprises a second metal contact structure comprising a second metallic contact layer above the gate stack structure. In some embodiments, the second metallic contact layer comprises a silicide of a metal and is partially or fully embedded in the gate stack structure.

In some embodiments, a method for forming such a semiconductor device comprises: providing a channel layer of at least one III-V semiconductor compound above a semiconductor substrate; forming a gate stack structure above a first portion of the channel layer; forming a source region and a drain (S/D) region above a second portion of the channel layer; and forming a first metal contact structure above the S/D regions. The first metal contact structure comprises a first metallic contact layer contacting the S/D regions. The first metallic contact layer comprises at least one metal-III-V semiconductor compound. In some embodiments, the forming a metallic material comprises: providing at least one III-V semiconductor compound above the second portion of the channel layer; and depositing a metal layer on the III-V semiconductor compound in the S/D regions, followed by a step of annealing the semiconductor device. In some embodiments, the method of forming such a semiconductor device also comprises forming a second metal contact structure comprising a second metallic contact layer above the gate stack structure. In some embodiments, the second metallic contact layer comprises a silicide of a metal and is partially or fully embedded in the gate stack structure.

In some embodiments, a semiconductor device comprises a semiconductor substrate; a channel layer of at least a first III-V semiconductor compound above the semiconductor substrate; a gate stack structure above a first portion of the channel layer; a source region and a drain region above a second portion of the channel layer, the source and the drain (S/D) regions comprising at least a second III-V semiconductor compound; a first metal contact structure above the S/D regions comprising a first metallic contact layer contacting the S/D regions; and a second metal contact structure comprising a second metallic contact layer above the gate stack structure. The first metallic contact layer comprises at least one metal-III-V semiconductor compound.

FIG. 1A illustrates a cross-sectional view of an exemplary III-V semiconductor CMOS device 100 according to one embodiment. FIG. 1B is an enlarged detail of FIG. 1A, showing components in the source/drain (S/D) region of the CMOS device, in accordance with some embodiments.

As shown in FIG. 1A, CMOS device 100 is formed over substrate 102, which, in some embodiments, is a semiconductor substrate such as silicon or silicon germanium or any other suitable semiconductor material. As in CMOS integrated circuits (ICs), the transistor comprises a shallow trench isolation region or a field oxide isolation region 104 above substrate 102. Isolation region 104 is made of oxides or other suitable insulating materials.

Buffer layer 106 is disposed over substrate 102. Buffer layer 106 is a III-V compound semiconductor in one embodiment, while other suitable buffer layers can be used in other embodiments. In some embodiments, a buffer layer of III-V semiconductor compounds is made of a combination of materials including a material from groups IIIA (B, Al, Ga, In, Tl) and a material from group VA (N, P, As, Sb, Bi) on the periodic table of elements. Examples of a material for buffer layer 106 include GaAs, InP, InAs and other III-V materials.

Isolator layer 108 is disposed over buffer layer 106. In some embodiments, isolator layer 108 is a III-V compound semiconductor material as described above. Various suitable isolator materials include but not limited to CdTeSe, ZnSeTe, MgSeTe, InAlAs and AlAsSb, which are used as isolator layer 108 in various embodiments. In some embodiments, isolator layer 108 has a larger semiconductor bandgap than the channel material 110. In other embodiments, isolator layer 108 is a buried dielectric material. In some other embodiments, isolator layer 108 and buffer layer 106 have a lattice match for a high quality of epitaxial growth of channel layer 110.

Channel layer 110 is disposed above isolator layer 108. Channel layer 110 and isolator layer 108 are referred as "active layers." In some embodiments, channel layer 110 is a III-V semiconductor compound or other suitable materials. It is at least a binary material and can be a ternary material in various embodiments. In some other embodiments, channel layer 110 shares a lattice structure matching with those of isolator layer 108 and buffer layer 106, but channel layer 110, isolator layer 108 and buffer layer 106 have different energy band gaps. In some embodiments, the material type of channel layer 110 determines the lattice structure, and the materials of isolator layer 108 and buffer layer 106 are selected based on the lattice structure of channel layer 110. For example, in one embodiment channel layer 110 is InAs, while isolator layer 108 is AlAsSb and buffer layer 106 is InAs.

According to some embodiments, channel layer 110 for NMOS is $In_xGa_{(1-x)}As$, with $x>0.7$ although other suitable binary or ternary NMOS channel materials can be used in other embodiments. According to some embodiments in which channel layer 110 for NMOS is $In_xGa_{(1-x)}As$, and $x=1.0$, NMOS channel material 108 is InAs.

According to some embodiments, channel layer 110 for PMOS is $In_yGa_{(1-y)}Sb$, with $0<y<1$ in some embodiments but various other suitable binary or ternary materials can be used in other embodiments. In some embodiments, channel layer 110 for PMOS is InSb or GaSb.

A CMOS transistor gate stack structure 120 is disposed above a first portion of channel layer 110. Gate stack structure 120 includes gate electrode and an insulating gate dielectric layer formed over channel material 110 and defines the gate region. In some embodiments, gate dielectric layer is a high-k dielectric material but other suitable dielectric materials can be used in other embodiments. Gate electrode is formed of various suitable gate materials such as metal, polysilicon, titanium nitride or other suitable semiconductor or metal materials.

For brevity, "gate stack" is also used to refer to structure comprising a gate electrode and gate dielectric layer. In the drawings, the detailed structure of the "gate stack" 120 is not shown.

Spacers 118 are disposed along two side walls of gate stack 120. In some embodiments, spacers 118 are not used. Spacers 118 can be formed of oxides, nitrides, oxynitrides, combinations thereof and other suitable insulating materials.

Source/drain regions 114 are disposed above a second portion of the channel layer. In some embodiments, source/drain regions 114 are made of a III-V semiconductor compound, or a derivative of a III-V semiconductor compound. In some embodiments, a material for source/drain regions 114 is a metallic ternary compound, such as nickelide compound, of a III-V semiconductor compound such as NiInP, NiInAs, and NiInSb. Such are examples only and in other embodiments, other suitable ternary nickelide materials or other suitable metal semiconductor ternary, quaternary or quinary materials can be used in source/drain region 114. In some embodiments, the metal-III-V-semiconductor compound is thermodynamically stable when contacting semiconductor materials. A material for source/drain region 114 is a low-resistance material as described above, and can include a resistance ranging from about 40 to 200 Ohms/sq. Compositions and method of making a ternary (or other combination) compound of a III-V semiconductor material and a metal or metals are disclosed in U.S. application Ser. No. 13/414,437 in the name of the same inventors.

In some embodiments, an exemplary device comprises a dopant layer comprising at least one dopant contacting at least one portion of the channel layer, while the dopant layer does not exist in some other embodiments. Such dopant layer provides low the external resistance in either a PMOS or an NMOS device. In some embodiments, the dopant layer is between channel layer 110 and the S/D regions 114. In some embodiments, semiconductor device 100 is an NMOS transistor, and channel layer 110 is $In_xGa_{(1-x)}As$, with $x>0.7$. In some embodiments, the dopant in dopant layer is selected from the group consisting of sulfur and silicon or any other suitable material which shows limited solid solubility in the S/D metal-semiconductor compound. In some embodiments, semiconductor device 100 is a PMOS transistor, and channel layer 110 is $In_yGa_{(1-y)}As$, with $0<y<1$. In some embodiments, the dopant is beryllium, germanium, tin, carbon, or any other suitable material which shows limited solid solubility in the S/D metal-semiconductor compound. Dopant layer is formed through a process selected from the group consisting of a monolayer doping process, an in-situ doping process, an implantation process, and any combinations thereof. Compositions and method of making such a dopant layer are disclosed in U.S. application Ser. No. 13/467,133, entitled "III-V COMPOUND SEMICONDUCTOR DEVICE HAVING DOPANT LAYER AND METHOD OF MAKING THE SAME", by Richard Kenneth Oxland et al.

As shown in FIG. 1B, in some embodiments, a first metal contact structure 116 comprises a metal layer 116-1, a diffusion barrier 116-2 contacting metal layer 116-1, and a metal plug 116-3 contacting diffusion barrier 116-2. Examples of metal layer 116-1 include but are not limited to Ni and Pd. Examples of diffusion barrier 116-2 include but are not limited to TiN. Examples of metal plug 116-3 include but are not limited to tungsten (W).

The first metal contact structure 116 is coupled to source/drain regions 114, and in various embodiments suitable low resistivity conductive metals such as copper, aluminum or their alloys or various other metals, are used as metal contact structure 116.

In some embodiments, the first metal contact structure 116 above the S/D regions 114 comprises a first metallic contact layer 116-4 contacting the S/D regions 114. The first metallic contact layer 116-4 comprises at least one metal-III-V semiconductor compound. In some embodiments, the first metallic contact layer 116-4 is partially or fully embedded in the S/D regions. The first metallic contact layer 116-4 is formed from a reaction between the metal layer 116-1 and III-V semiconductor compound in the S/D regions 114.

In some embodiments, the first metallic contact layer 116-4 is a metallic ternary compound, such as nickelide compound, of a III-V semiconductor compound such as NiInP, NiInAs, and NiInSb. Such are examples only and in other embodiments, other suitable ternary nickelide materials or other suitable metal semiconductor ternary, quaternary or quinary materials can be used.

The resistance of source/drain extensions ($R_{ext}$) is reduced with introduction of the first metallic contact layer 116-4. In some embodiments, $R_{ext}$ is further reduced with a combination of the first metallic contact layer 116-4 and source/drain (S/D) regions 114 comprising a metal-semiconductor compound such as nickelide, of III-V semiconductor compound. Reduction in total resistance of device 110 can be demonstrated in the following equation:

$$R_{total}=R_{channel}+2*(R_{S/D}+R_{extension}+R_{c,1}+R_{c,2})$$

$$R_{ext}=2*(R_{S/D}+R_{extension}+R_{c,1}+R_{c,2})$$

where
$R_{total}$ is total resistance of device 110;
$R_{S/D}$ is resistance of source/drain regions 114;
$R_{channel}$ is resistance of channel layer 110;
$R_{extension}$ is resistance of the portion of source/drain regions 114 and/or channel layer 110 under spacer 118;
$R_{c,1}$ is contact resistance between metal contact structure 116 and source/drain regions 114;
$R_{c,2}$ is contact resistance between source/drain regions 114 and channel layer 110.

In some embodiments, the first metallic contact layer 116-4 provides higher conductivity between the first metal contact structure 116 and the S/D regions 114 and decreases the corresponding resistance $R_{c,1}$. In some other embodiment, source/drain (S/D) regions 114 comprising a metal-semiconductor compound such as nickelide, of III-V semiconductor compound, further decrease $R_{S/D}$ and contact resistance $R_{c,1}$ and $R_{c,2}$. In some embodiments, both the first metallic contact layer 116-4 and source/drain (S/D) regions 114 comprise a metallic ternary compound, and decrease $R_{ext}$.

The shape and dimension of device 100 and each portion in FIGS. 1A and 1B are for illustration purpose, and the examples shown herein are not limiting. For example, source/drain regions 114 are recessed in some embodiments as shown in FIG. 1A-1B. In some embodiments, source/drain regions 114 are not recessed. In the "recessed" source/drain regions, the channel layer 110 is etched before formation of source/drain regions 114 so that a portion of the source region or the drain region or both is below a bottom height of spacer 118. In some embodiments, regrowth of source/drain regions 114 is performed through a selective epitaxial growth technique. In some other embodiments, source/drain regions 114 are disposed after recess without using an epitaxial growth technique.

Figure 2:
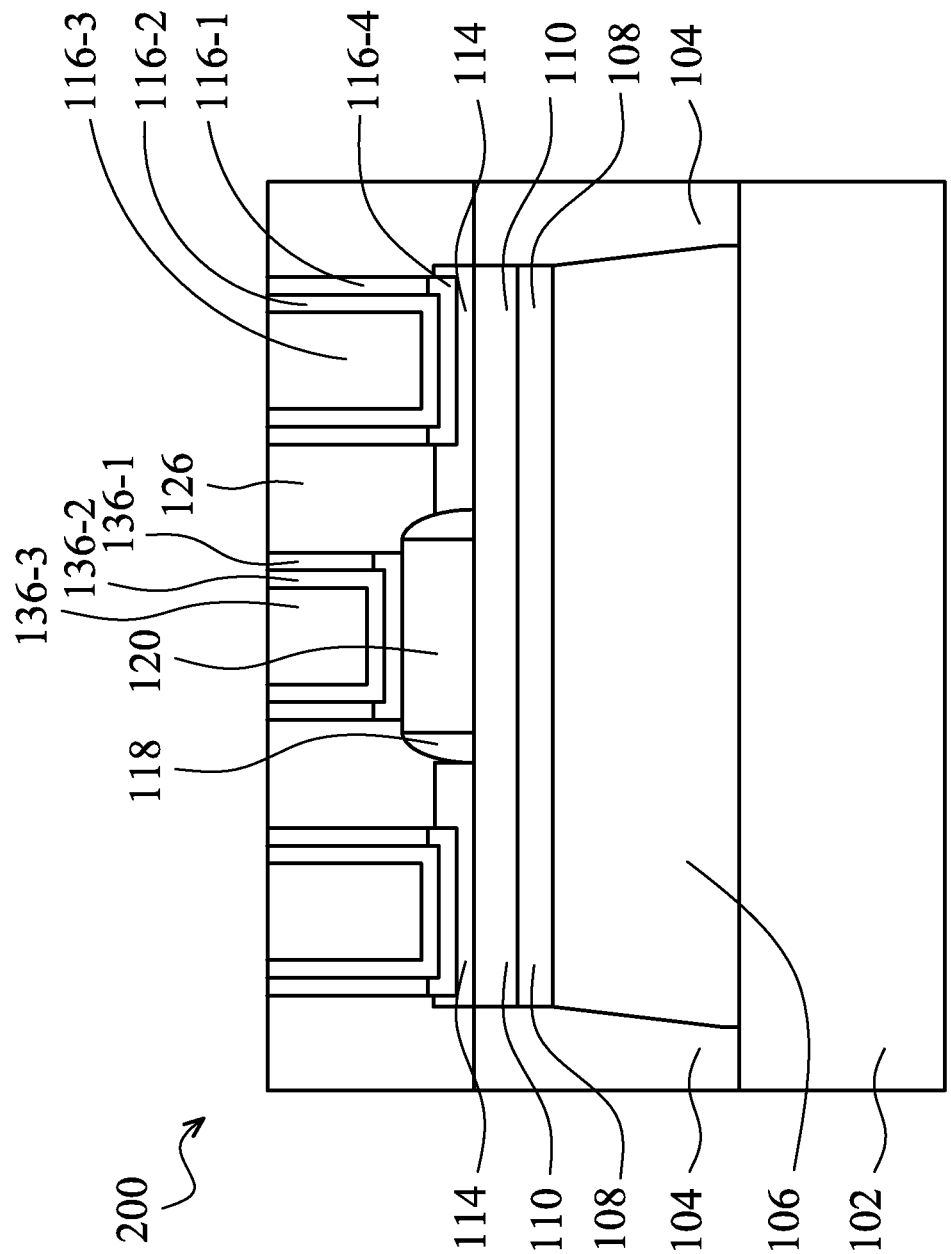
FIG. 2 illustrates a cross-sectional view of an exemplary CMOS device with epitaxial growth but without recess of the source/drain (S/D) region in accordance with some embodiments.
Figure 3:
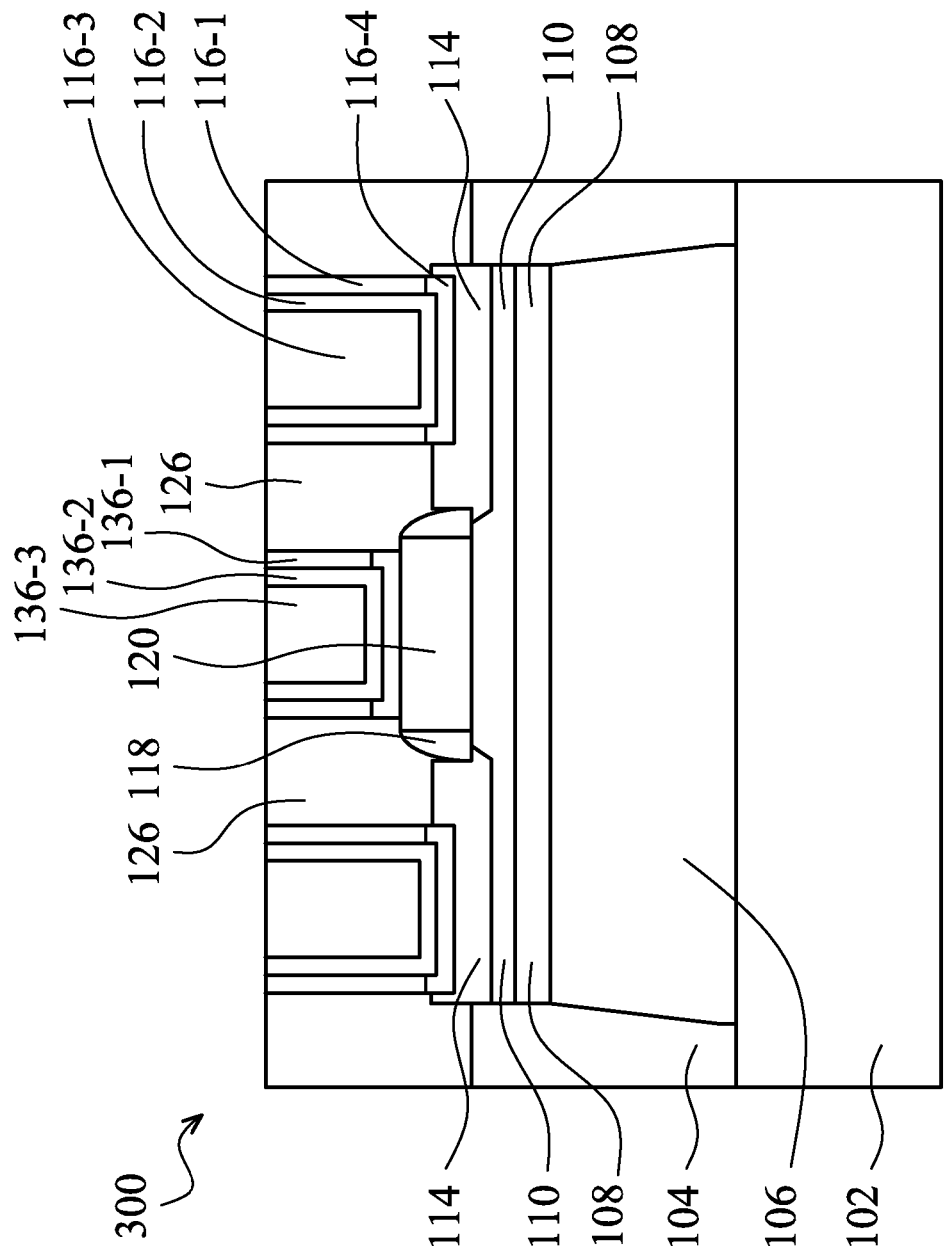
FIG. 3 illustrates a cross-sectional view of an exemplary CMOS device with recess of the source/drain (S/D) region and epitaxial regrowth in accordance with some embodiments.

In some embodiments, the exemplary device 100 comprises a second metal contact structure 136 (not shown in FIG. 1A) comprising a second metallic contact layer 136-1, a diffusion barrier 136-2 and a metal plug 136-3, above gate stack structure 120. Second metal contact structure 136 comprising a second metallic contact layer 136-1 is shown in FIGS. 2-3. In some embodiments, the second metallic layer 136-1 directly contacts the metal gate stack. In some embodiments, the second metallic contact layer 136-1 comprises a silicide of a metal and is partially or fully embedded in gate stack structure 120. The silicide is formed from a reaction between polysilicon in gate stack structure 120 and a second meal contact structure. The details of such a second metallic contact layer above gate stack 120 are described in FIGS. 18A and 18B. The silicide-containing second metallic contact layer is labeled as 136-4 in FIG. 18B.

FIG. 2 illustrates a cross-sectional view of an exemplary CMOS device with epitaxial growth, but without recess of the source/drain (S/D) region in accordance with some embodiments. In FIG. 2, like items are indicated by like reference numerals, and for brevity, descriptions of the structures, provided above with reference to FIGS. 1A and 1B are not repeated. The exemplary device 200 in FIG. 2 is similar to that in FIG. 1A-1B, except that the source/drain regions 114 are not recessed. In the "non-recessed" source/drain regions, the channel layer 110 is not etched before formation of source/drain regions 114 so that any portion of the source region or the drain region is above a bottom height of spacer 118.

FIG. 3 illustrates a cross-sectional view of an exemplary CMOS device 300 with recess of the source/drain (S/D) region and epitaxial regrowth in accordance with some embodiments.

The device in FIG. 3 is similar to that in FIG. 1A. FIG. 1A is a cross-sectional view of a device in some embodiments. In some embodiments illustrated in FIG. 3, source/drain regions 114 are recessed. As described above, in the "recessed" source/drain regions, the channel layer 110 is etched before formation of source/drain regions 114 so that a portion of the source region or the drain region or both is below a bottom height of spacer 118.

Figure 4:
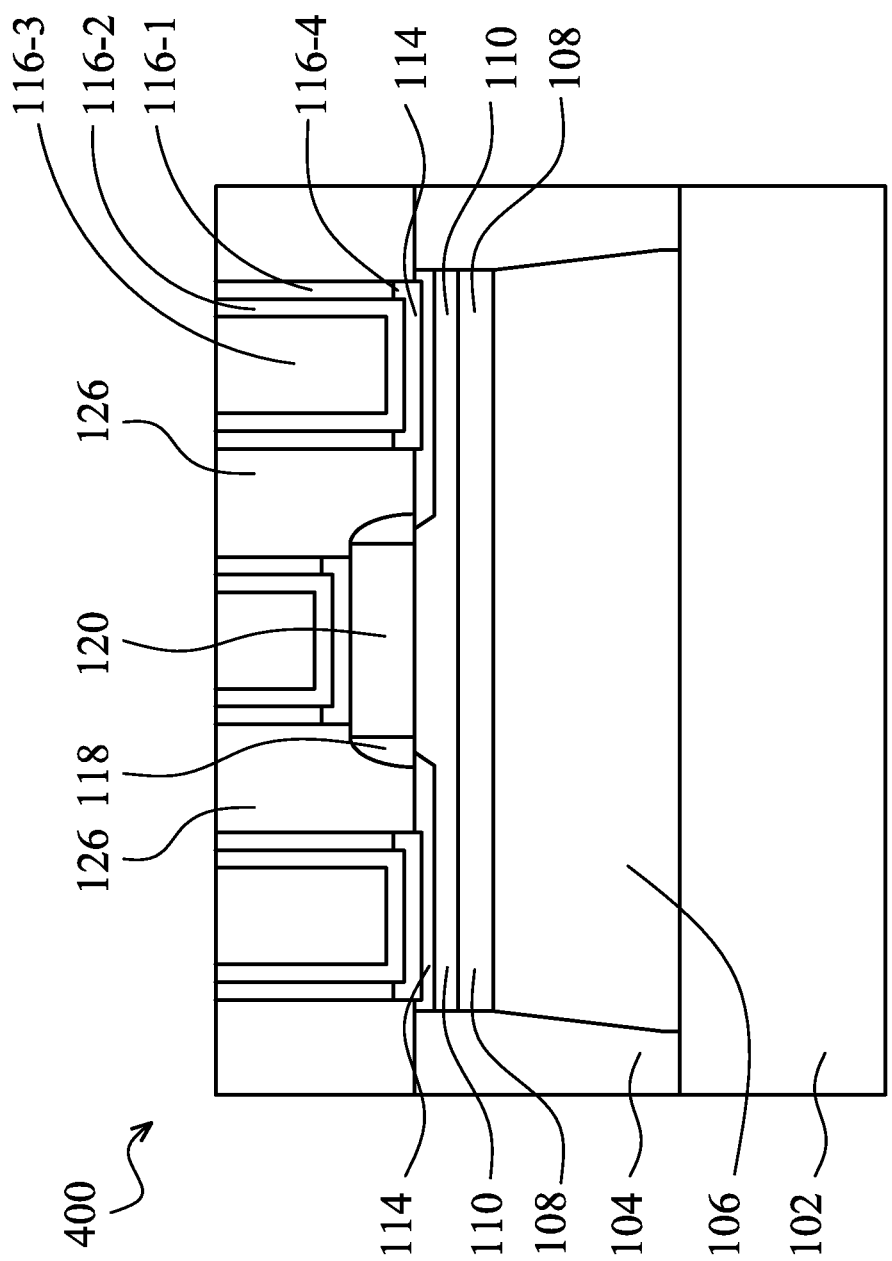
FIG. 4 illustrates a cross-sectional view of an exemplary CMOS device without epitaxial growth of the source/drain (S/D) region in accordance with some embodiments.

FIG. 4 illustrates a cross-sectional view of an exemplary CMOS device 400 without epitaxial growth of the source/drain (S/D) region 114 in accordance with some embodiments. In some embodiments, as shown in FIG. 4, the S/D regions 114 are recessed. As described above, in the "recessed" source/drain regions 114, the channel layer 110 is etched before formation of source/drain regions 114 so that a portion of the source region or the drain region or both is below a bottom height of spacer 118.

In some embodiments, semiconductor device 400 is an NMOS transistor. Channel layer 110 is $In_xGa_{(1-x)}As$, with x>0.7. Source/drain (S/D) regions 114 comprise a metal-semiconductor compound, such as nickelide, of III-V semiconductor compound. The examples of source/drain (S/D) regions 114 include but are not limited to NiInAs, NiInP, and NiInSb. Nickel or other suitable metals are deposited onto source/drain regions 114, and then fully reacted to form the metallic compound. In some embodiments, S/D regions 114 comprise a dopant selected from the group consisting of sulfur and silicon. In some other embodiments, S/D regions 114 do not comprise such a dopant.

As shown in FIGS. 2-4, the exemplary devices 200-400 also comprise a second metal contact 136 which is similar to or the same as the first metal contact 116 above the S/D regions 114. The second metal contact 136 also comprises a second metallic layer 136-1. In some embodiments, the second metallic layer 136-1 directly contacts metal gate stack 120. In some embodiments, the second metallic contact layer 136-1 comprises a silicide of a metal and is partially or fully embedded in the gate stack structure 120.

According the foregoing described embodiments, III-V compound semiconductor devices, which include a first metallic contact layer 116-4 comprising a metal-III-V semiconductor compound contacting the S/D regions 114, can be fabricated based on different combination of the described structures. For example, the device can be either a PMOS or an NMOS device. The source/drain (S/D) regions 114 can be recessed or not recessed. When the S/D regions 114 are recessed, additional semiconductor material can be added to the S/D regions 114. In some embodiments, the variations in the structure are further combined with different processing steps of forming the dopant layer and the source/drain regions, as described below.

Figure 5:
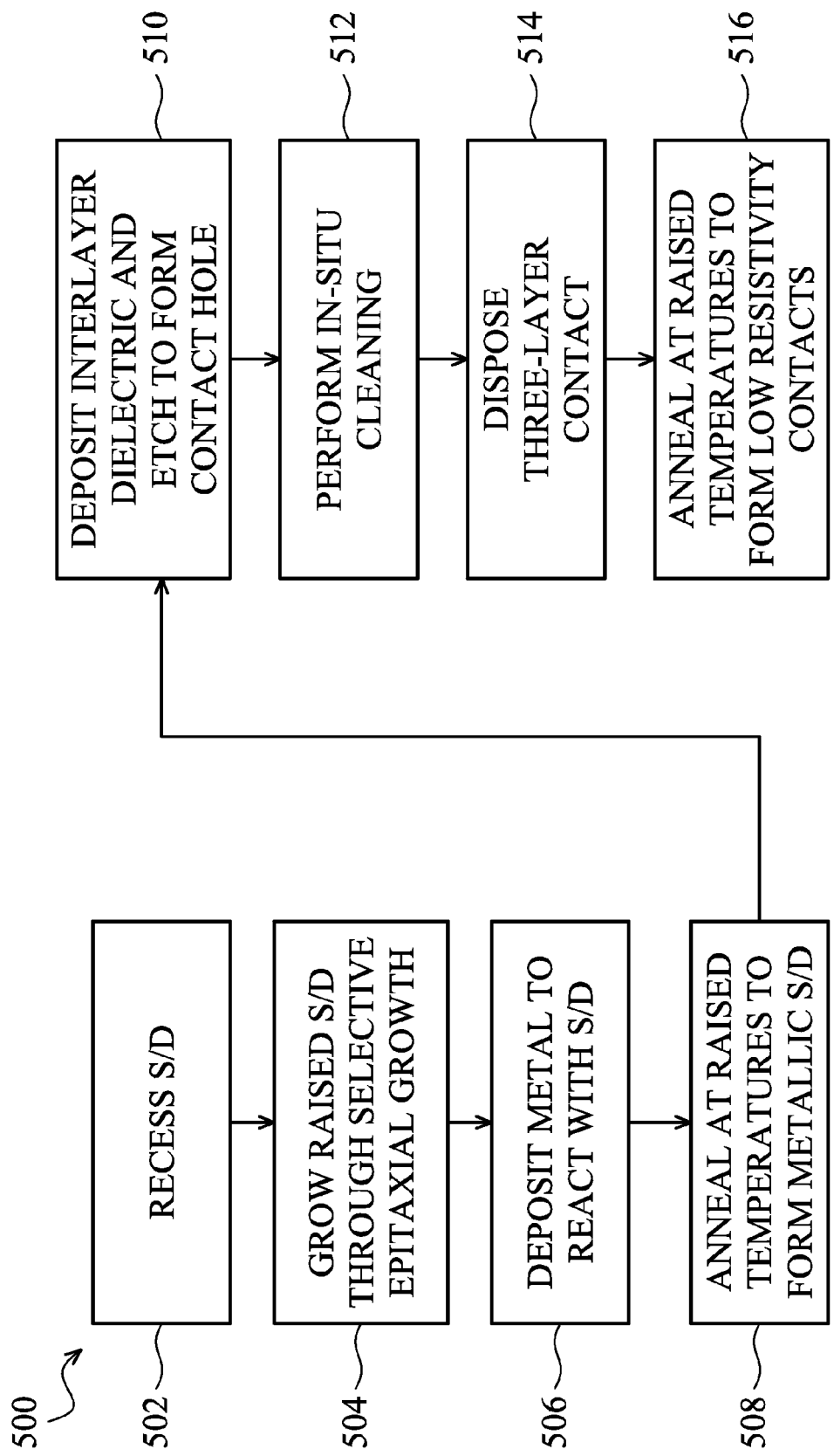
FIG. 5 is a flow chart diagram illustrating a method of fabricating the exemplary CMOS devices in accordance with some embodiments.

FIG. 5 is a flow chart diagram 500 illustrating a method of fabricating the exemplary CMOS devices in accordance with some embodiments. Step 502, 504 or 512 is used in some embodiments, and is not used in some other embodiments. FIGS. 6-15 illustrate structures of different stages in the methods of fabricating the exemplary CMOS device in accordance with some embodiments. The steps of forming isolation regions 104, a buffer layer 106, an isolator layer 108, a channel layer 110, a gate stack 120 including the dielectric layer, and a spacer 118, above the substrate 102 are not shown in the related diagrams. Gate stack structure 120 including dielectric layer and gate electrode (not shown) is disposed over a first portion of channel layer 110. A spacer 118 is disposed along a side-wall of the gate stack structure 120.

Figure 6:
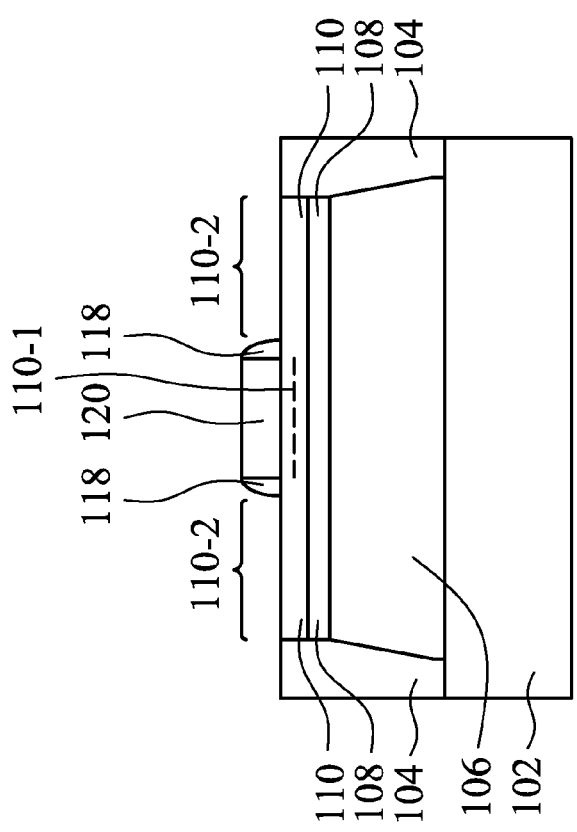

FIG. 6 illustrates an exemplary CMOS device having a channel layer 110 comprising a III-V semiconductor compound during fabrication, in accordance with some embodiments.

Step 502 is used in some embodiments, but is not used in some other embodiments. In step 502 of FIG. 5, a second portion (110-2) of channel 110 which is in the S/D regions 114 in the exemplary CMOS device is recessed. As shown in FIG. 6, the first portion (110-1) of channel layer 110 refers to the portion of channel layer 110 where gate stack structure 120 is disposed above. The second portion (110-2) refers to the portions where the S/D regions 114 are formed. For brevity, the descriptions about the first and second portion of channel layer 110 are not repeated. In step 502, before source/drain (S/D) regions 114 are formed, a second portion (110-2) of channel layer 110 is etched using processing techniques, so that a portion of source/drain (S/D) regions 114 to be formed subsequently is below a bottom height of spacer 118.

Figure 7:
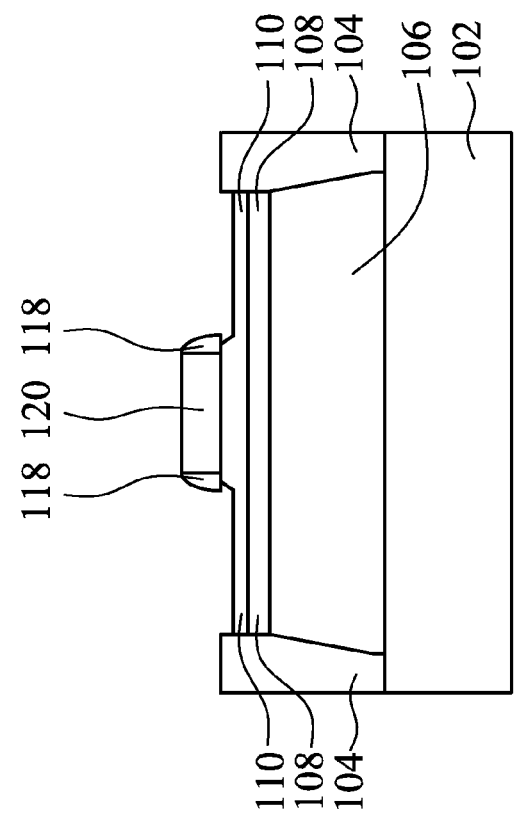

FIG. 7 illustrates the CMOS device of FIG. 6 after step 502 of recessing the second portion 110-2 of channel 110 through etching in accordance with some embodiments. In some embodiments, at the completion of this step of recessing channel 110, the configuration is as shown in FIG. 7.

Figure 8:
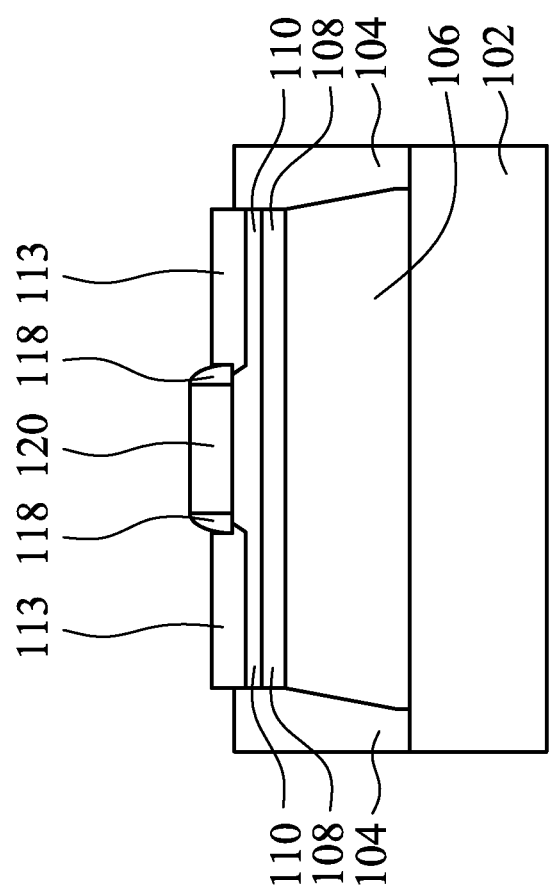

Step 504 is used in some embodiments, but is not used in some other embodiments. In step 504 of FIG. 5, the S/D regions 113 of FIG. 8 are grown using a selective epitaxial growth technique. Reference numbers 113 and 114 are used to describe the S/D regions formed during and after the fabrication stages, respectively. In some embodiments, this step follows the processing procedures used for III-V semiconductor compounds. FIGS. 7-8 schematically illustrate a method of selective epitaxial growth of the source/drain (S/D) regions 113 in accordance with one embodiment. The S/D regions 113 at this step comprises III-V semiconductor compound (but without any metals). The S/D regions 113 through epitaxial growth include a thickness of about 5-200 nm according to some embodiments and is InAs in an embodiment. In other embodiments, the S/D regions 113 are formed of InGaAs, InP, InSb or other suitable semiconductor materials. In some embodiments, during the selective epitaxial growth of a III-V semiconductor in the source/drain regions 113, dopants are introduced in the grown layer as part of the epitaxial process. In some other embodiments, no dopant is introduced in the epitaxial process.

FIG. 8 illustrates the structure of the CMOS device of FIG. 7 after disposing the S/D regions 113 comprising a III-V semiconductor compound through selective epitaxial growth, in accordance with some embodiments.

In steps 506 and 508 of FIG. 5, a metallic metal-III-V semiconductor compound is formed through metal coating and annealing, in the S/D regions 113, which are transformed into S/D regions 114 comprising a metal-III-V semiconductor compound. FIGS. 9-10 illustrate the structures in the process for forming a metallic metal-semiconductor compound material in the S/D regions 114, comprising coating a layer of metal at step 506 followed by annealing at a raised temperature, for example, in the range of 250-500° C., in step 508 in accordance with some embodiments.

At step 506, a metal layer 210 is deposited on the S/D regions 113, which comprise a III-V semiconductor compound. FIG. 9 illustrates the structure of the CMOS device of FIG. 8 after coated with a layer of metal after step 506, in accordance with some embodiments.

A material for metal layer 210 is nickel in some embodiments or other suitable metals in some other embodiments. Various deposition methods such as sputtering, evaporation or other deposition (e.g. chemical vapor deposition CVD) methods can be used to form metal layer 210 including nickel, for example. Various thicknesses can be used. In some embodiments, metal layer 210 such as nickel can include a thickness ranging from about 5 nm to about 200 nm. According to some embodiments, metal layer 210 will be formed to include sufficient thickness to react with the S/D regions.

At step 508, the metal layer 210 coated structure from step 506 is annealed at a raised temperature such as a temperature in the range of 250-500° C. to form a metallic metal-semiconductor compound material of a III-V semiconductor compound. FIG. 10 illustrates the CMOS device of FIG. 9 after the step of annealing at a raised temperature after step 508, in accordance with some embodiments. The metal in excess is removed. After these two steps, the S/D regions 113 comprising a III-V semiconductor compound changes to the S/D regions 114 comprising a metal-III-V semiconductor compound. The material in the S/D regions 114 is a metallic ternary, quaternary or quinary material.

After step 508 of FIG. 5, a metal-semiconductor compound such as nickelide of a III-V semiconductor material is formed in the CMOS device of FIG. 10 through annealing at high temperature such as a temperature in the range of 250-500° C. The thermal annealing causes reaction to form a ternary, quaternary or quinary nickelide material. The annealing operation can be a one-step operation or a multi-step operation. According to one embodiment, a two-step annealing process is used with the first step being a lower temperature step, for example, within a temperature range of 275-325° C., causing diffusion of the nickel metal into the underlying semiconductor material. After the first annealing step, a selective etching operation is used to remove unreacted nickel in accordance with some embodiments. Such a selective etching operation is not used in some other embodiments. A second annealing operation of the two-step annealing operation is carried out at higher temperature, for example, in the range of 325-450° C. In some embodiments, the second annealing operation forms a thermodynamically stable ternary material that includes low resistance as described above.

Examples of a metallic metal-semiconductor ternary, quaternary or quinary material include but are not limited to nickelide. In some embodiments, examples of a ternary nickelide include NiInP, NiInAs and NiInSb Referring back to FIG. 5, steps 510-516 illustrates a process of forming a first metal contact structure 116 above the S/D regions 114 and/or the metal contact structure comprising a first metallic contact layer 116-4 contacting the S/D regions 114, in accordance with some embodiments. FIGS. 11-15 illustrate structures in each step, in accordance with some embodiments.

In step 510, a dielectric material 126 is deposited over the semiconductor device of FIG. 10, and then is etched to form contact openings 127 over S/D regions 114 and gate stack 120. In some embodiments, dielectric material 126 is a void free interlayer dielectric (ILDO). Examples of dielectric material 126 include but are not limited to silicon dioxide.

Figure 11:
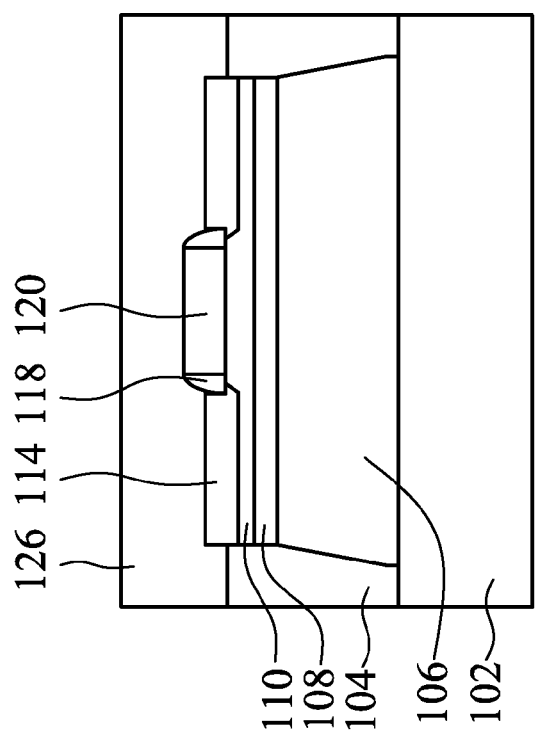

FIG. 11 is the cross-section view of the structure after dielectric material 126 is deposited onto the CMOS device of FIG. 10, in accordance with some embodiments.

Figure 12:
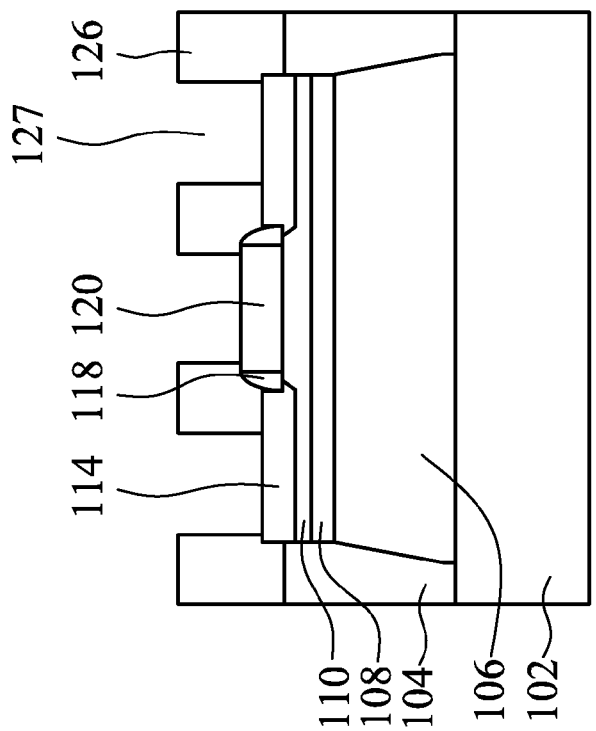

FIG. 12 illustrates the structure after a dielectric material 126 is etched to form contact openings 127 onto the CMOS device of FIG. 11, in accordance with some embodiments. In some embodiments, at least two contact openings 127 are above the S/D regions 114. In some embodiments, at least one contact opening 127 is formed above gate stack 120.

Figure 13:
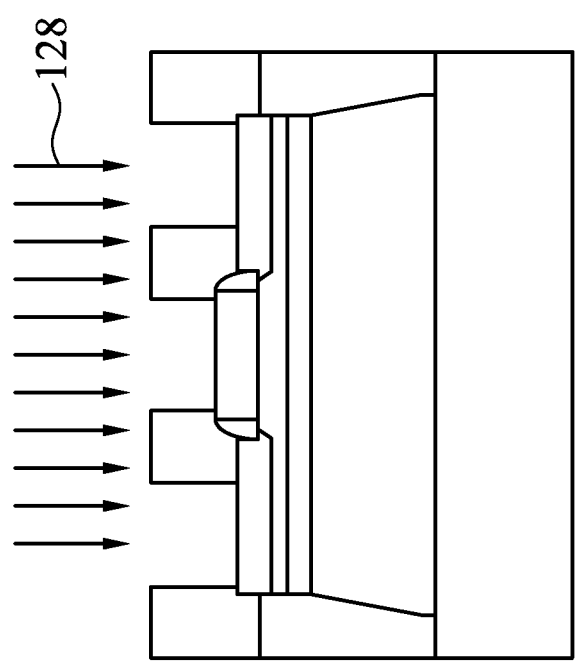

Step 512 is a step for cleaning the contact opening using plasma or other suitable method. Step 512 is used in some embodiments, but is not used in some other embodiments. FIG. 13 illustrates a process of cleaning the contact opening 127 of the CMOS device of FIG. 12, in accordance with some embodiments. In some embodiments, the cleaning process includes any wet clean steps which are in CMOS or III-V MOSFET processing before the cleaning with plasma 128. In some embodiments, the plasma cleaning process is conducted in such a way that the III-V semiconductor material on the surface of device of FIG. 13, including S/D regions 114, is not exposed to reactive elements such as oxygen, or any other material that may degrade the surface before deposition of a first metal layer 116-1.

In step 514, a first metal contact 116 having three-layer structure comprising 116-1, 116-2 and 116-3 as described in FIG. 1B, is disposed into the contact openings 207 above the S/D regions 114. A metal contact structure 116 comprises a metal layer 116-1, a diffusion barrier 116-2 contacting metal layer 116-1, and a metal plug 116-3 contacting diffusion barrier 116-2, as described in FIGS. 1A and 1B. In some embodiments, a second metal contact 136 having similar or the same three-layer structure comprising a second metallic contact layer 136-1, a diffusion barrier 136-2 and a metal plug 136-3 as described in FIGS. 2-4, is disposed into the contact opening 127 above gate stack 120. In some embodiments, diffusion barrier 136-2 is identical to diffusion barrier 116-2, and metal plug 136-3 is identical to metal plug 116-3. In accordance with some embodiments, the second metallic contact layer 136-1 is identical to metal layer 116-1.

In step 514, for each of metal contact 116, metal layer 116-1 is first deposited using metal deposition techniques. In some embodiments, a chemical vapor deposition (CVD) process is used. In some embodiments, an anisotropic, directional deposition technique is used to limit deposition of metal layer 116-1 on the sidewall of the contact openings 127. Diffusion barrier 116-2, which is a second metal layer, is then deposited over metal layer 116-1 using metal deposition techniques such as CVD. In some embodiments, this deposition is conducted in such a way that the surface of metal layer 116-1 is not exposed to any reactive elements such as oxygen or any other material that may degrade the surface before deposition of diffusion barrier 116-2. After deposition of metal layer 116-1 and diffusion barrier 116-2, a metal plug 116-3 is then deposited over diffusion barrier 116-2 using metal deposition techniques such as CVD. In some embodiments, this deposition is conducted in such a way that the surface of metal layer 116-1 or 116-2 is not exposed to any reactive elements such as oxygen or any other material that may degrade the surface before deposition of metal plug 116-3.

In some embodiments, three layers including the second metallic contact layer 136-1, diffusion barrier 136-2 and metal plug 136-3 in the second metal contact structure 136 above gate stack 120 are deposited using the method described above for metal layer 116-1, diffusion barrier 116-2 and metal plug 116-3, respectively.

FIG. 14 illustrates the exemplary CMOS device of FIG. 13 after steps of disposing a first metal contact 116 comprising a metal layer 116-1 contacting the S/D regions 114, and a second metal contact structure 136 comprising a second metallic contact layer 136-1 contacting gate stack 120, in accordance with some embodiments.

As described in FIGS. 1A and 1B, the first metal contact structure 116 comprises a metal layer 116-1, a diffusion barrier 116-2 contacting metal layer 116-1, and a metal plug 116-3 contacting diffusion barrier 116-2. Examples of metal layer 116-1 include but are not limited to Ni and Pd. Examples of diffusion barrier 116-2 include but are not limited to TiN. Examples of metal plug 116-3 include but are not limited to tungsten (W). The second metal contact 136 above gate stack 120 also has similar or the same structure in some embodiments.

In some embodiments, the second metal contact structure 136 above gate stack 120 comprises the second metallic contact layer 136-1, diffusion barrier 136-2 contacting second metallic contact layer 136-1, and metal plug 136-3 contacting diffusion barrier 136-2. In accordance with some embodiments, the second metallic contact layer 136-1 is a metal layer identical to metal layer 116-1. Examples of the second metallic contact layer 136-1 include but are not limited to Ni and Pd. Examples of diffusion barrier 136-2 include but are not limited to TiN. Examples of metal plug 136-3 include but are not limited to tungsten (W).

In step 516, the structure is annealed according to a process similar to step 508. For brevity, the details are not repeated.

FIG. 15 illustrates the exemplary CMOS device of FIG. 14 after a step of annealing at a raised temperature, for example, in the range of 250-500° C., in accordance with some embodiments.

After step 516, the first metal contact structure 116 above the S/D regions 114 comprises a first metallic contact layer 116-4 contacting the S/D regions 114. The first metallic contact layer 116-4 comprises at least one metal-III-V semiconductor compound. In some embodiments, the first metallic contact layer 116-4 is partially or fully embedded in the S/D regions. The first metallic contact layer 116-4 is formed from a reaction between the metal layer 116-1 and III-V semiconductor compound in the S/D regions 114.

In some embodiments, the first metallic contact layer 116-4 is a metallic ternary compound, such as nickelide compound, of a III-V semiconductor compound such as NiInP, NiInAs, and NiInSb. Such are examples only and in other embodiments, other suitable ternary nickelide materials or other suitable metal semiconductor ternary, quaternary or quinary materials can be used.

In some embodiments, the second metallic contact layer 136-1 is similar to the first metallic contact layer 116-4, comprising a metal-III-V semiconductor compound.

Figure 16B:
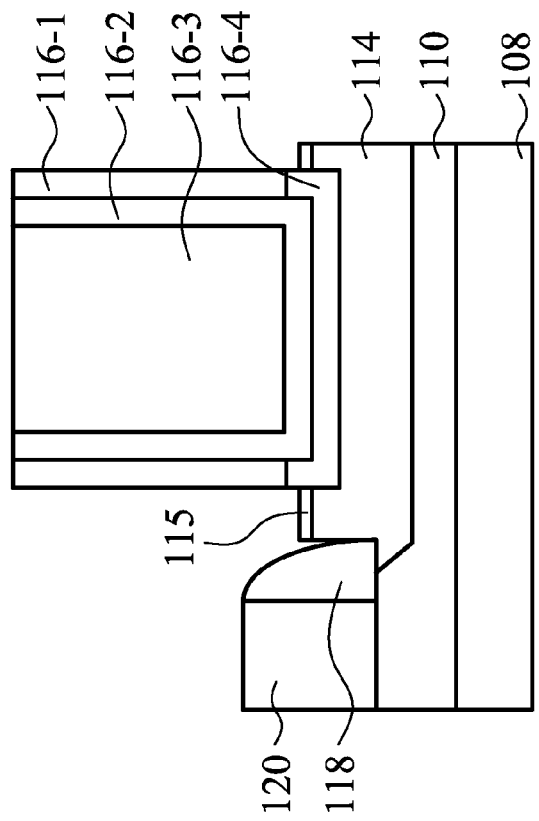
FIGS. 16A and 16B illustrate the S/D regions having high resistance native oxide layer before and after steps of FIGS. 14 and 15, in accordance with some embodiments.
Figure 16A:
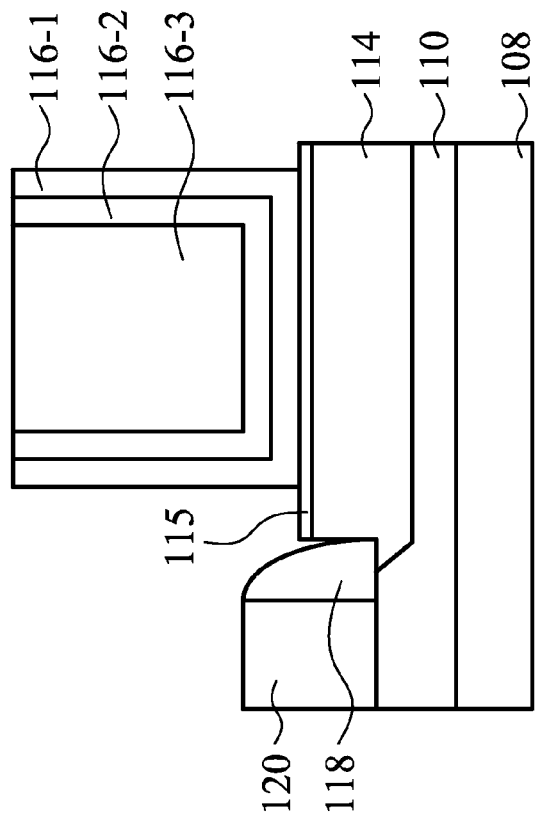

In some embodiments, III-V semiconductor compound in the S/D regions become oxidized to form a native oxide layer having high resistance. FIGS. 16A and 16B illustrate the S/D regions 114 having high resistance native oxide layer 115 before and after step 516, in the structures of FIGS. 14 and 15, in accordance with some embodiments. After the process of metallization at step 514 and annealing at step 516, the native oxide layer 115 of III-V semiconductor is dispersed through reactive diffusion during the formation of the first metallic contact layer 116-4. The first metallic contact layer 116-4 contacting S/D regions 114 without interfacial native oxide layer provides low resistance contact between metal contact 116 and S/D regions 114.

In some embodiments, the first metal contact structure 116 has no excess reactive metal layer 116-1 on the side wall in the three layer structure.

Figure 17B:
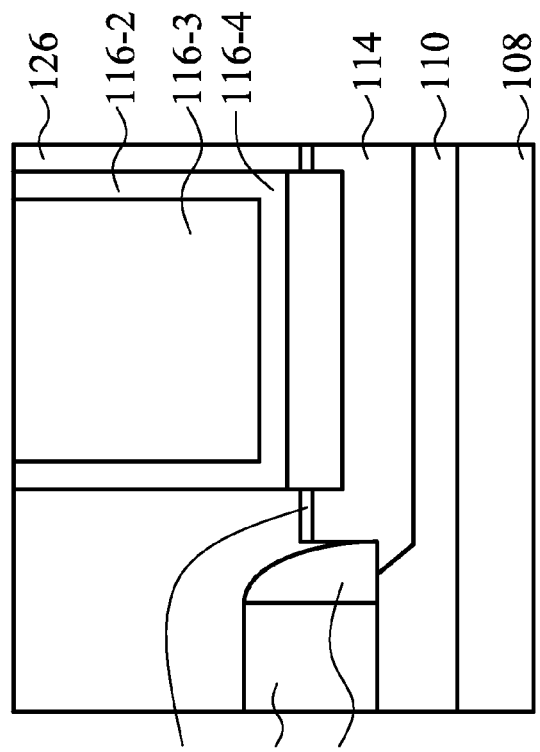
FIGS. 17A and 17B illustrate the S/D regions having no excess reactive metal on the side wall of the first metal contact after steps of FIGS. 14 and 15, in accordance with some embodiments.
Figure 17A:
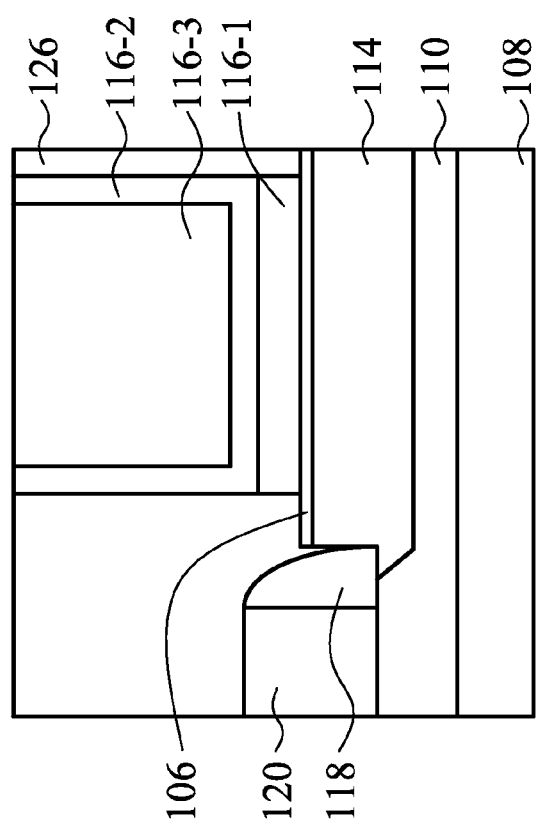

FIGS. 17A and 17B illustrate the S/D regions 114 having no excess reactive metal (metal layer 116-1) on the side wall of the etched contact opening after steps of FIGS. 14 and 15, in accordance with some embodiments.

Figure 18B:
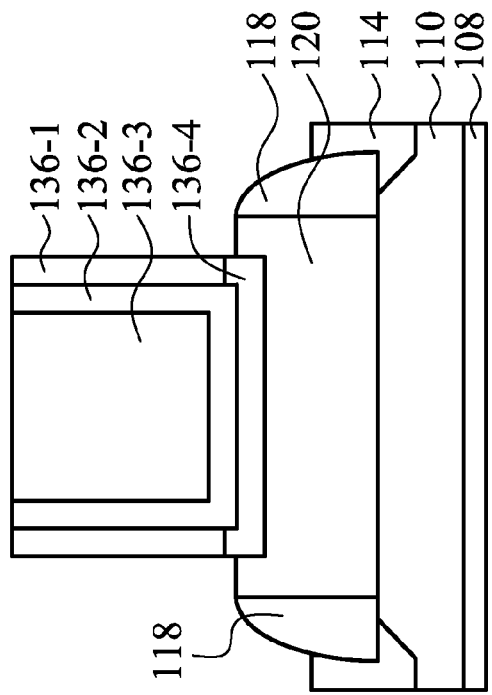
FIGS. 18A and 18B illustrate the gate stack of polysilicon before and after steps of FIGS. 14 and 15, in accordance with some embodiments.
Figure 18A:
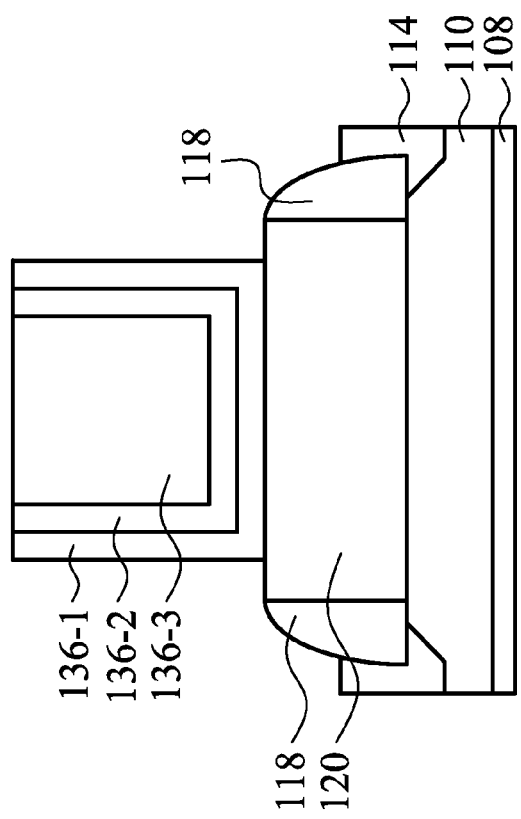

FIGS. 18A and 18B illustrate gate stack 120 comprising polysilicon, before and after step 516, corresponding to structures of FIGS. 14 and 15, respectively, in accordance with some embodiments. Gate stack 120 comprises polysilicon in some embodiments, and does not comprise polysilicon in some other embodiments. As shown in FIG. 18A, the second metal contact 136 above gate stack 120 is of three-layer structure including the second metallic contact layer 136-1, diffusion barrier 136-2 and metal plug 136-3 as described above. After the annealing step 516 of FIG. 5, as shown in FIG. 18B, the second metallic contact layer 136-1 reacts with polysilicon in gate stack 120 to form a contact layer 136-4 which comprises a metallic silicide compound. This silicide-containing second metallic contact layer is labeled as 136-4. The metallic silicide compound in the silicide-containing second metallic contact layer 136-4 may diffuse into and become embedded in gate stack 120. In some embodiments, gate stack 120 comprises a metal electrode only (without any polysilicon); the whole metal contact 136 is above gate stack 120.

In various embodiments, a III-V compound semiconductor device and a method of making the same are provided to reduce external/extrinsic resistance and resistance in the S/D extension region.

In some embodiments, a semiconductor device comprises a semiconductor substrate; a channel layer of at least one III-V semiconductor compound above the semiconductor substrate; a gate stack above a first portion of the channel layer; a source region and a drain region above a second portion of the channel layer; and a first metal contact structure above the S/D regions comprising a first metallic contact layer contacting the S/D regions. The source/drain regions above a second portion of the channel comprise at least a second III-V semiconductor compound. The first metallic contact layer in the first metal contact structure above the second portion of the channel comprises at least one metal-III-V semiconductor compound.

In some embodiments, such a first metallic contact layer is partially embedded in the S/D regions. In some embodiments, the at least one metal-III-V semiconductor compound in the first metallic contact layer is a material of at least one metal and the at least second III-V semiconductor compound in the S/D regions. In some embodiments, the S/D regions further comprise a metal-III-V semiconductor compound. In some embodiment, the at least one metal-III-V semiconductor compound in the first metallic contact layer and the metal-III-V semiconductor compound in the S/D regions are nickelide.

In some embodiments, the first metal contact structure further comprises a diffusion barrier contacting the metallic contact layer, and a metal plug contacting the diffusion barrier.

In some embodiments, the semiconductor device further comprises a spacer disposed along a side wall of the gate stack, wherein the S/D regions are recessed so that a portion of the S/D regions is below a bottom height of the spacer. In some embodiments, the semiconductor device further comprises a second metal contact structure above the gate stack structure. The second metal contact structure comprises a second metallic contact layer contacting the gate stack structure. In some embodiments, the gate electrode of the gate stack structure is a metal, and the second metallic contact layer is disposed on the top surface of the gate structure. In some other embodiments, the gate stack structure comprises polysilicon, and the second metallic contact layer comprises a silicide of a metal and is partially embedded in the gate stack structure. In some embodiments, the second metal contact structure further comprises a diffusion barrier contacting the second metallic contact layer, and a metal plug contacting the diffusion barrier.

In some embodiments, a method for forming a semiconductor device comprises: providing a channel layer of at least one III-V semiconductor compound above a semiconductor substrate; forming a gate stack structure above a first portion of the channel layer; forming a source region and a drain (S/D) region above a second portion of the channel layer; and forming a first metal contact structure above the S/D regions. The first metal contact structure comprises a first metallic contact layer contacting the S/D regions. The first metallic contact layer comprises at least one metal-III-V semiconductor compound.

In some embodiments, forming a source region and a drain (S/D) region comprises forming a metallic material with a III-V semiconductor compound in the S/D regions. In some embodiments, forming a metallic material comprises providing at least one III-V semiconductor compound above the second portion of the channel layer; and depositing a metal layer on the III-V semiconductor compound in the S/D regions, followed by a step of annealing the semiconductor device.

In some embodiments, providing a first metal contact structure above the S/D regions comprises: forming a metal layer contacting the S/D regions; forming a diffusion barrier contacting the metal layer; and providing a metal plug contacting the diffusion barrier.

In some embodiments, providing a first metal contact structure above the S/D regions comprises a step of forming the first metallic contact layer comprising at least one metal-III-V semiconductor compound through a step of annealing.

In some embodiments, the method of forming semiconductor device further comprises forming a spacer along a side wall of the gate stack. In some embodiments, the step of forming the source region and the drain region above the second portion of the channel layer comprises disposing a portion of the source region and a portion of the drain region below a bottom height of the spacer.

In some embodiments, the gate stack structure comprises a metal or polysilicon. In some embodiments, in the method of forming semiconductor devices, the forming of the first metal contact structure comprises: forming a metal layer onto the top surface of the gate stack structure; forming a diffusion barrier contacting the metal layer; filling the diffusion barrier with a metal plug; and annealing the semiconductor device.

In some embodiments, a semiconductor device comprises a semiconductor substrate; a channel layer of at least a first III-V semiconductor compound above the semiconductor substrate; a gate stack structure above a first portion of the channel layer; a source region and a drain region above a second portion of the channel layer, the source and the drain (S/D) regions comprising at least a second III-V semiconductor compound; a first metal contact structure above the S/D regions comprising a first metallic contact layer contacting the S/D regions; and a second metal contact structure comprising a second metallic contact layer above the gate stack structure. The first metallic contact layer comprises at least one metal-III-V semiconductor compound. In some embodiments, the second metallic contact layer directly contacts the gate stack structure. In some embodiments, the second metallic contact layer in the second metal contact structure above the gate stack structure comprises silicide of a metal. In some embodiments, the second metallic contact layer comprising silicide is partially embedded in the gate stack structure.

Although the subject matter has been described in terms of exemplary embodiments, it is not limited thereto. Rather, the appended claims should be construed broadly, to include other variants and embodiments, which may be made by those of ordinary skill in the art.

What is claimed is:

1. A semiconductor device comprising:
a semiconductor substrate;
a channel layer of at least a first III-V semiconductor compound above the semiconductor substrate;
a gate stack structure above a first portion of the channel layer;
a source region and a drain region above a second portion of the channel layer, the source and the drain (S/D) regions comprising at least a second III-V semiconductor compound; and
a first metal contact structure above the S/D regions comprising a first metallic contact layer contacting the S/D regions, the first metallic contact layer comprising at least one metal-III-V semiconductor compound;
wherein the S/D regions further comprise a metal-III-V semiconductor compound, and the at least one metal-III-V semiconductor compound in the first metallic contact layer and the metal-III-V semiconductor compound in the S/D regions are nickelide.

2. The semiconductor device of claim 1, wherein the at least one metal-III-V semiconductor compound in the first metallic contact layer is a material of at least one metal and the at least second III-V semiconductor compound in the S/D regions, the at least one metal comprising nickel.

3. The semiconductor device of claim 2, wherein the at least one metal-III-V semiconductor compound in the first metallic contact layer is a ternary, quaternary or quinary material of the at least one metal and the at least second III-V semiconductor compound in the S/D regions.

4. The semiconductor device of claim 2, wherein the at least one metal-III-V semiconductor compound in the first metallic contact layer comprises a compound selected from the group consisting of NiInP, NiInAs and NiInSb.

5. The semiconductor device of claim 1, wherein the first metal contact structure further comprises a diffusion barrier contacting the metallic contact layer, and a metal plug contacting the diffusion barrier.

6. The semiconductor device of claim 5, wherein the first metal contact structure further comprises a metal layer above the first metallic contact layer and contacting the diffusion barrier.

7. The semiconductor device of claim 6, wherein the metal layer above the first metallic contact layer comprises Ni or Pd.

8. The semiconductor device of claim 1, further comprising a spacer disposed along a side wall of the gate stack structure, wherein the S/D regions are recessed so that a portion of the S/D regions is below a bottom height of the spacer.

9. The semiconductor device of claim 1, further comprising a second metal contact structure above the gate stack structure, the second metal contact structure comprising a second metallic contact layer contacting the gate stack structure.

10. The semiconductor device of claim 9, wherein the gate stack structure comprises polysilicon, and the second metallic contact layer comprises a silicide of a metal and is partially embedded in the gate stack structure.

11. The semiconductor device of claim 9, wherein the second metal contact structure further comprises a diffusion barrier contacting the second metallic contact layer, and a metal plug contacting the diffusion barrier.

12. The semiconductor device of claim 9, wherein the gate stack structure comprises a metal, and the second metallic contact layer is disposed on the top surface of the gate structure.

13. A semiconductor device comprising:
a semiconductor substrate;
a channel layer of at least a first III-V semiconductor compound above the semiconductor substrate;
a gate stack structure above a first portion of the channel layer;
a source region and a drain region above a second portion of the channel layer, the source and the drain (S/D) regions comprising at least a second III-V semiconductor compound;
a first metal contact structure above the S/D regions comprising a first metallic contact layer contacting the S/D regions, the first metallic contact layer comprising at least one metal-III-V semiconductor compound; and
a second metal contact structure above the gate stack structure, the second metal contact structure comprising a second metallic contact layer contacting the gate stack structure,
wherein the gate stack structure comprises polysilicon, and the second metallic contact layer comprises a silicide of a metal.

14. The semiconductor device of claim 13, wherein the second metal contact structure further comprises a diffusion barrier contacting the second metallic contact layer, and a metal plug contacting the diffusion barrier.

15. The semiconductor device of claim 13, further comprising a spacer disposed along a side wall of the gate stack structure, wherein the S/D regions are recessed so that a portion of the S/D regions is below a bottom height of the spacer.

16. A semiconductor device comprising:
a semiconductor substrate;
a channel layer of at least a first III-V semiconductor compound above the semiconductor substrate;
a gate stack structure above a first portion of the channel layer;
a source region and a drain region above a second portion of the channel layer, the source and the drain (S/D) regions comprising at least a second III-V semiconductor compound and a metal-III-V semiconductor compound; and
a first metal contact structure above the S/D regions comprising a first metallic contact layer contacting the S/D regions, the first metallic contact layer comprising at least one metal-III-V semiconductor compound; and
a spacer disposed along a side wall of the gate stack, wherein the S/D regions are recessed so that a portion of the S/D regions is below a bottom height of the spacer,
wherein the at least one metal-III-V semiconductor compound in the first metallic contact layer and the metal-III-V semiconductor compound in the S/D regions are nickelide.

17. The semiconductor device of claim 16, wherein the first metal contact structure further comprises a diffusion barrier contacting the metallic contact layer, a metal plug contacting the diffusion barrier, and a metal layer above the first metallic contact layer and contacting the diffusion barrier.

18. The semiconductor device of claim 16, further comprising a second metal contact structure above the gate stack structure, the second metal contact structure comprising a second metallic contact layer contacting the gate stack structure.

19. The semiconductor device of claim 18, wherein the gate stack structure comprises polysilicon, and the second metallic contact layer comprises a silicide of a metal and is partially embedded in the gate stack structure.

20. The semiconductor device of claim 18, wherein the second metal contact structure further comprises a diffusion barrier contacting the second metallic contact layer, a metal plug contacting the diffusion barrier, and a metal layer above the second metallic contact layer and contacting the diffusion barrier in the second metal contact structure.

* * * * *